United States Patent
Kai (10) Patent No.: US 11,488,846 B2
(45) Date of Patent: Nov. 1, 2022

(54) SUBSTRATE PROCESSING METHOD AND SUBSTRATE PROCESSING APPARATUS

(71) Applicant: TOKYO ELECTRON LIMITED, Tokyo (JP)

(72) Inventor: Akiko Kai, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 97 days.

(21) Appl. No.: 17/083,096

(22) Filed: Oct. 28, 2020

(65) Prior Publication Data

US 2021/0134615 A1 May 6, 2021

(30) Foreign Application Priority Data

Nov. 1, 2019 (JP) .............................. JP2019-199625

(51) Int. Cl.
*H01L 21/67* (2006.01)
*H01L 21/02* (2006.01)
*H01L 21/027* (2006.01)

(52) U.S. Cl.
CPC .... *H01L 21/6715* (2013.01); *H01L 21/02057* (2013.01); *H01L 21/0273* (2013.01); *H01L 21/67034* (2013.01); *H01L 21/0271* (2013.01); *H01L 21/67028* (2013.01); *H01L 21/67051* (2013.01)

(58) Field of Classification Search
CPC ... H01L 21/027–0338; H01L 21/00–86; G03F 7/00–70991
See application file for complete search history.

(56) References Cited

U.S. PATENT DOCUMENTS 6,472,127 B1 * 10/2002 Takizawa ................ G03F 7/168
430/330
2011/0205505 A1 * 8/2011 Somervell ................ G03F 7/30
219/443.1

FOREIGN PATENT DOCUMENTS

JP 2011-14935 A 1/2011
JP 2011014935 A * 1/2011 .......... H01L 21/304

* cited by examiner

*Primary Examiner* — Mikhail Kornakov
*Assistant Examiner* — Richard Z. Zhang
(74) *Attorney, Agent, or Firm* — Nath, Goldberg & Meyer; Jerald L. Meyer; Tanya E. Harkins (57) ABSTRACT

A substrate processing method includes supplying a water-soluble polymer solution to a surface of a substrate having, on a surface of the substrate, a resist film on which no pattern is formed, after an immersion exposure process, hydrophilizing a surface of the resist film using the supplied water-soluble polymer solution, supplying, after the hydrophilizing, a cleaning liquid to the surface of the substrate while rotating the substrate to remove the water-soluble polymer solution that has not contributed to the hydrophilizing, and drying the substrate supplied with the cleaning liquid, wherein the water-soluble polymer solution has a pH value that allows an acid concentration in the resist film to fall within a permissible range.

9 Claims, 7 Drawing Sheets

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-199625, filed on Nov. 1, 2019, the entire contents of which are incorporated herein by reference.

TECHNICAL FIELD

The present disclosure relates to a substrate processing method and a substrate processing apparatus.

BACKGROUND

Patent Document 1 discloses a substrate cleaning apparatus including a rotatable substrate holder configured to horizontally hold a substrate, a cleaning liquid nozzle configured to supply a cleaning liquid to the surface of the substrate held by the substrate holder, and a driving part configured to move the cleaning liquid nozzle. In this substrate cleaning apparatus, the driving part moves the cleaning liquid nozzle such that the position where the cleaning liquid is supplied from the cleaning liquid nozzle moves from the central portion of the substrate toward the peripheral edge while the substrate is rotating.

PRIOR ART DOCUMENT

Patent Document

Patent Document 1: Japanese Laid-Open Patent Publication No. 2011-14935

SUMMARY

According to embodiments of the present disclosure, a substrate processing method includes supplying a water-soluble polymer solution to a surface of a substrate having, on the surface of the substrate, a resist film on which no pattern is formed; after an immersion exposure process, hydrophilizing a surface of the resist film using the supplied water-soluble polymer solution; supplying, after the hydrophilizing, a cleaning liquid to the surface of the substrate while rotating the substrate to remove the water-soluble polymer solution that has not contributed to the hydrophilizing; and drying the substrate supplied with the cleaning liquid, wherein the water-soluble polymer solution has a pH value that allows an acid concentration in the resist film to fall within a permissible range.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a photolithography process in a process of manufacturing, for example, semiconductor devices, a series of processes are performed to form a desired resist pattern on a semiconductor wafer (hereinafter referred to as "wafer"). The series of processes include, for example, a resist-coating process for forming a resist film by supplying a resist liquid onto the wafer, an exposure process for exposing the resist film, a development process for developing the exposed resist film by supplying a developer, and the like.

The type of exposure described above includes immersion exposure. Immersion exposure is a method of performing exposure through a water film formed between a lens provided at the tip end of an exposure head and a wafer surface. Desired patterns are sequentially transferred onto the wafer by repeating exposure while causing the exposure head to perform scanning in a state in which the water film is formed. In this immersion exposure, water repellency is made high on the surface of the wafer, specifically the surface of the resist film, for the purpose of allowing the water film to follow the exposure head.

Water used for immersion exposure (hereinafter, referred to as "immersion water") may remain as water droplets on the surface of the wafer after the exposure. The water droplets are dried through a post-exposure baking (PEB) process performed after the exposure and before the development process, and become a water stain as a defect. Therefore, the surface of the wafer after exposure is cleaned to remove the water droplets of immersion water. For example, in Patent Document 1, as described above, the water droplets remaining on the substrate are reduced by moving the cleaning liquid nozzle while the substrate is rotating such that the cleaning liquid supply position from the cleaning liquid nozzle moves from the central portion of the substrate toward the peripheral edge.

However, with only the conventional post-exposure cleaning process in which, while a wafer is being rotated at a constant speed, the cleaning liquid nozzle is moved such that the cleaning liquid supply position moves from the central portion of the wafer toward the peripheral edge, there are cases where the water droplets of immersion water may not be removed depending on the degree of water repellency of the surface of the wafer before cleaning. Hereinafter, this point will be described.

In the conventional post-exposure cleaning process described above, when the rotation speed of the wafer is appropriate, the cleaning liquid ejected from the cleaning liquid nozzle forms a lump on the wafer. The lump is directed toward the peripheral edge of the wafer to draw a spiral while widening its width in the circumferential direction, and is discharged to the outside of the wafer as it is. In that process, the water droplets of the immersion water on the wafer are collected in the above-mentioned lump of the cleaning liquid and are discharged to the outside of the wafer together with the lump. Meanwhile, in the above-mentioned conventional post-exposure cleaning process, when the rotation speed of the wafer is high, the cleaning liquid ejected from the cleaning liquid nozzle collides with the wafer and scatters, and thus, no lump of the cleaning liquid is formed. Thus, the droplets of the immersion water cannot be collected, and small droplets of the cleaning liquid are newly formed. Further, even if a lump of the cleaning liquid is formed, the lump collapses at the peripheral edge portion, which also causes small droplets of the cleaning liquid to be newly formed. The small droplets of the cleaning liquid thus formed are difficult to be discharged because a centrifugal force acting on the small droplets is small even at a high rotation speed because the droplets have a small mass. However, because the surface of the wafer used for immersion exposure has high water repellency as described above, that is, because the contact angle of the surface with respect to water is high, the upper limit of the rotation speed of the wafer at which the cleaning liquid does not scatter when the cleaning liquid is caused to collide is low. In addition, in the conventional post-exposure cleaning process described above, if the rotation speed of the wafer is set too low, the centrifugal force acting on, for example, the cleaning liquid becomes small, and water droplets remain on the wafer. Accordingly, depending on the degree of contact angle of the surface of the wafer after immersion exposure, a permissible range of the appropriate rotation speed of the wafer is narrow, and it takes time to determine the processing conditions for the rotation speed. Thus, there are cases where it may be practically impossible to remove the immersion water or the droplets of cleaning liquid from the wafer. Naturally, if the upper limit of the rotation speed of the wafer at which the cleaning liquid does not scatter is lower than the lower limit of the rotation speed of the wafer at which water droplets are not left on the wafer, it is practically impossible to completely remove the immersion water and the cleaning liquid from the wafer even if the rotation speed is adjusted.

Therefore, in a substrate processing method and a substrate processing apparatus for processing a substrate having, on a surface thereof, a resist film, on which no pattern is formed, after immersion exposure, the technique according to the present disclosure prevents water or a cleaning liquid used for the immersion exposure from remaining on the surface of the processed substrate, regardless of the degree of the contact angle of the surface of the substrate before processing.

Hereinafter, a substrate processing apparatus and a substrate processing method according to the present embodiment will be described with reference to the drawings. In the specification and drawings, elements having substantially the same functional configurations will be denoted by the same reference numerals, and redundant explanations will be omitted.

Figure 1:
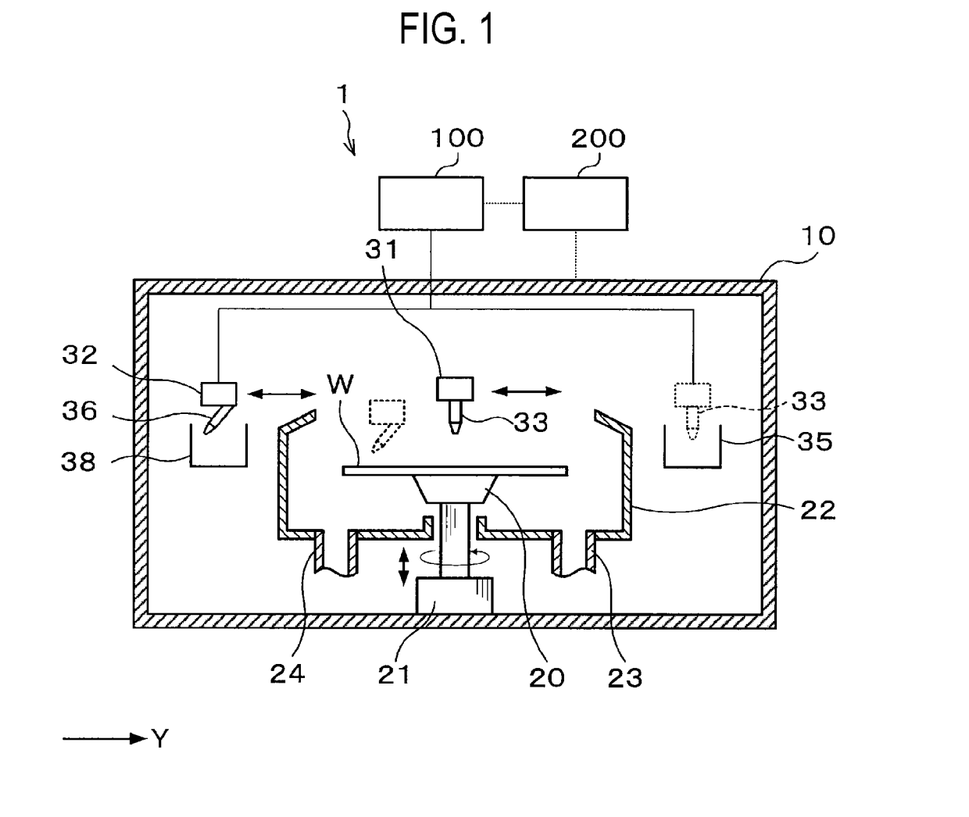
FIG. 1 is a vertical cross-sectional view schematically illustrating a configuration of a cleaning apparatus as a substrate processing apparatus according to an embodiment.
Figure 2:
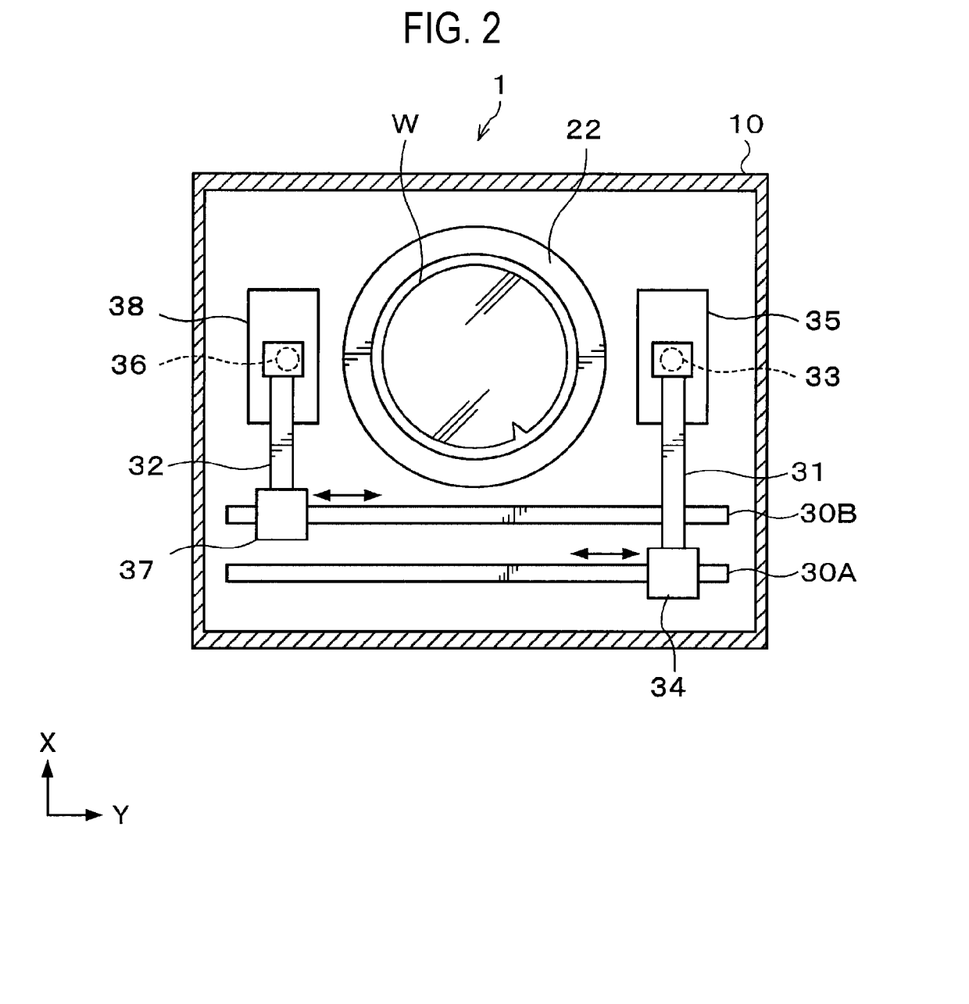
FIG. 2 is a horizontal cross-sectional view schematically illustrating a configuration of the cleaning apparatus as a substrate processing apparatus according to an embodiment.

FIGS. 1 and 2 are vertical and horizontal cross-sectional views, respectively, that schematically illustrate a configuration of a cleaning apparatus 1 as a substrate processing apparatus according to the present embodiment.

The cleaning apparatus 1 uses, as a processing object, that is, a cleaning object, a wafer W as a substrate having, on a surface thereof, a resist film, on which no pattern is formed, after immersion exposure. Specifically, the wafer W as a cleaning object of the cleaning apparatus 1 is a wafer after immersion exposure and before a PEB process. The material of the resist film formed on the wafer W as a cleaning object is a chemically amplified resist, and may be a positive type or a negative type. Hereinafter, the resist film is assumed to be a positive type.

The cleaning apparatus 1 has a processing container 10, the inside of which is capable of being sealed, as illustrated in FIG. 1. A wafer W loading/unloading port (not illustrated) is formed in the side surface of the processing container 10, and an opening/closing shutter (not illustrated) is provided in the loading/unloading port.

In the processing container 10, a spin chuck 20 as a substrate holding part configured to hold a wafer W and to rotate the wafer W around a vertical axis is provided. The spin chuck 20 has a horizontal top surface, and a suction port (not illustrated) configured to suction, for example, a wafer W, is provided in the top surface. The wafer W can be attached to and held on the spin chuck 20 by suction from the suction port. Further, below the spin chuck 20, a chuck driver 21 as a rotation mechanism is provided. The chuck driver 21 includes, for example, a motor, and is capable of rotating the spin chuck 20 at various rotation speeds. Further, the chuck driver 21 is provided with a lifting drive mechanism having, for example, a cylinder (not illustrated), and the spin chuck 20 is configured to be able to be raised and lowered by the lifting drive mechanism.

A cup 22 is provided around the spin chuck 20 so as to surround the wafer W held on the spin chuck 20. The cup 22 receives and recovers liquid scattered or dropped from the wafer W. A discharge pipe 23 for discharging the recovered liquid and an exhaust pipe 24 for evacuating the inside of the cup 22 are connected to the bottom surface of the cup 22.

As illustrated in FIG. 2, rails 30A and 30B extending in the Y direction (in the left-and-right direction in FIG. 2) are disposed on the negative side of the cup 22 in the X direction (the lower side in FIG. 2). The rails 30A and 30B are disposed, for example, from the outer side of the cup 22 on the negative side in the Y direction (the left side in FIG. 2) to the outer side on the positive side in the Y direction (the right side in FIG. 2). The rails 30A and 30B are provided with corresponding arms 31 and 32, respectively.

A solution supply nozzle 33 is supported on the first arm 31 to supply a water-soluble polymer solution. The first arm 31 is configured to be movable on the rail 30A by a nozzle driver 34 as a movement mechanism. As a result, the solution supply nozzle 33 is movable to a position above the central portion of the wafer W in the cup 22 from a standby portion 35 provided outside the cup 22 on the positive side in the Y direction. The first arm 31 is capable of being raised and lowered by the nozzle driver 34 so that the height of the solution supply nozzle 33 can be adjusted.

The water-soluble polymer solution supplied by the solution supply nozzle 33 is for collecting and discharging water droplets of immersion water remaining on the surface of a resist film after immersion exposure and for reducing the contact angle of a resist pattern with respect to water after immersion exposure.

The water-soluble polymer contained in the water-soluble polymer solution includes, for example, a hydrophilic group and has an alkyl group as a main chain. Specific examples of the water-soluble polymer include polyvinyl alcohol, polyacrylic acid derivative, polyvinylpyrrolidone, cellulose derivative, vinyl sulfonic acid, fluoroacrylic acid, fluorosulphonic acid, acrylic acid ester or methacrylic acid ester, and salts thereof. These water-soluble polymers may be used alone or in combination of two or more. The molecular weight of the water-soluble polymer is, for example, 2000 or less. The concentration of the water-soluble polymer in the solution is preferably less than 10%, and more preferably less than 3%. This is because it is necessary to coat the entire surface of the wafer W with a water-soluble polymer aqueous solution, but if the concentration of the water-soluble polymer is high, coatability is poor.

A neutral solution is used as the water-soluble polymer solution. The reason will be described later.

The solvent of the water-soluble polymer solution is water, specifically, pure water. Hereinafter, the water-soluble polymer solution will be referred to as a polymer aqueous solution.

A surfactant may be added to the polymer aqueous solution mainly for the purpose of improving the coatability on the wafer W and manipulating pH (liquid property). Specific examples of the surfactant include sorbitan monooleate, glycerol α-monooleate, polyethylene glycol sorbitan fatty acid ester, polyethylene glycol linear alkyl ether, polyethylene glycol phenyl ether linear alkyl addition type, branched chain alkyl addition type, acetylene glycol, anionic sodium laurate, sodium stearate, sodium oleate, sodium dodecyl sulfate, and sodium dodecyl benzene sulfonate. These surfactants may be used alone or in a combination of two or more. The concentration of the surfactant in the polymer aqueous solution is preferably less than 3%. However, if the pH of the water-soluble polymer falls within the range described below, the concentration of the surfactant in the polymer aqueous solution may exceed 3%. In addition, other additives may be added to the polymer aqueous solution to control the pH. Further, no organic solvent is added to the polymer aqueous solution for the purpose of improving the coatability.

A cleaning liquid supply nozzle 36 is supported on the second arm 32 to supply a cleaning liquid. The second arm 32 is movable on the rail 30B by a nozzle driver 37 as a movement mechanism. As a result, the cleaning liquid supply nozzle 36 is movable to a position above the central portion of the wafer W in the cup 22 from a standby portion 38 provided outside the cup 22 on the negative side in the Y direction. The second arm 32 is capable of being raised and lowered by the nozzle driver 37 so that the height of the cleaning liquid supply nozzle 36 can be adjusted.

The cleaning liquid supplied by the cleaning liquid supply nozzle 36 is a water-based cleaning liquid, specifically, deionized water (DIW).

The solution supply nozzle 33 and the cleaning liquid supply nozzle 36 are connected to a liquid supply mechanism 100 configured to supply a corresponding liquid to each nozzle. The liquid supply mechanism 100 includes, for each nozzle, for example, a pump (not illustrated) configured to forcibly feed each liquid and a supply valve (not illustrated) configured to switch supply and stop of supply of each liquid.

The cleaning apparatus 1 described above is provided with a controller 200 as illustrated in FIG. 1. The controller 200 is a computer including, for example, a CPU and a memory, and includes a program storage (not illustrated). The program storage stores programs for controlling various processes in the cleaning apparatus 1. Further, the program storage also stores programs for controlling, for example, the chuck driver 21, the nozzle drivers 34 and 37, and the liquid supply mechanism 100 described above so as to realize a development process to be described later. The program may be recorded in a non-transitory computer-readable storage medium, and may be installed in the controller 200 from the storage medium. Some or all of the programs may be implemented by dedicated hardware (a circuit board).

Figure 3:
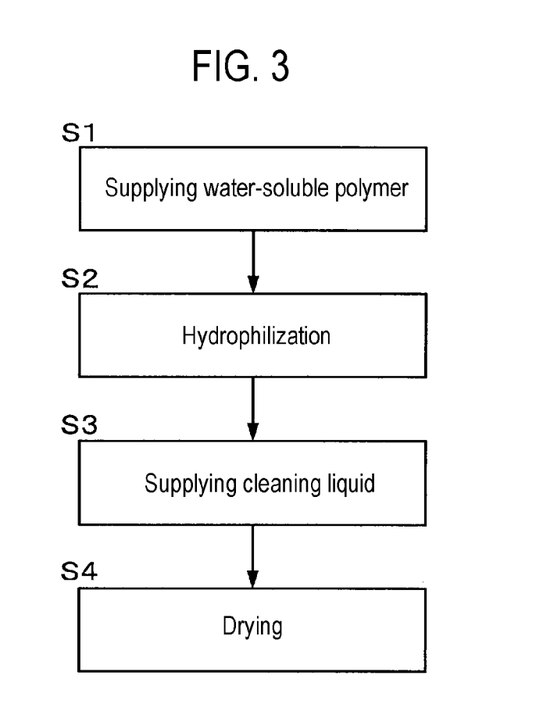
FIG. 3 is a flowchart illustrating an exemplary cleaning process in the cleaning apparatus of FIG. 1.

Here, an exemplary cleaning process in the cleaning apparatus 1 will be described with reference to FIGS. 3 to 5. FIG. 3 is a flowchart illustrating an exemplary cleaning process. FIGS. 4A to 4F are perspective views schematically illustrating states of a wafer W and each nozzle in respective processes related to a cleaning process. FIGS. 5A to 5D are cross-sectional views schematically illustrating states of a wafer surface before or after processes related to the cleaning process are executed. In the following description, it is assumed that no protective film is formed on the surface of a resist film, but a protective film may be formed. In that case, the "surface of the resist film" means the surface of the protective film.

(Aqueous Solution Supply Process)

Figure 4A:
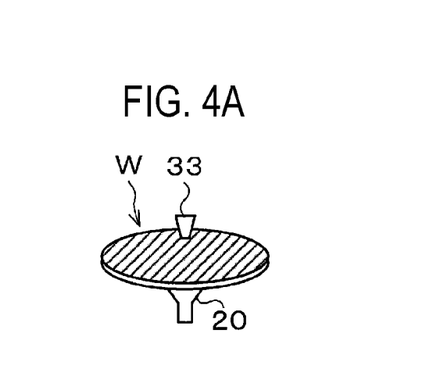
FIGS. 4A to 4F are perspective views schematically illustrating states of a wafer and each nozzle in respective processes related to a cleaning process.
Figure 4B:
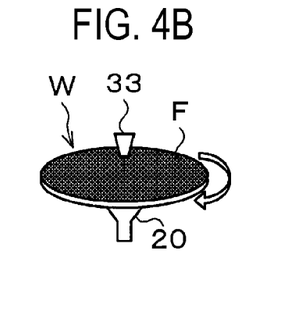

During a cleaning process in the cleaning apparatus 1, first, as illustrated in FIG. 3, a polymer aqueous solution is supplied to a wafer W (process S1). Specifically, first, a wafer W having a flat surface in which a pattern is not formed after the immersion exposure, is carried into the processing container 10, and is placed on and suctioned to the spin chuck 20. Next, as illustrated in FIG. 4A, the solution supply nozzle 33 is moved to a position above the center of the wafer W. Then, as illustrated in FIG. 4B, the wafer W is rotated, and a polymer aqueous solution is supplied from the solution supply nozzle 33 to the wafer W. As a result, a liquid film F of the polymer aqueous solution is formed on the entire surface of the wafer W. The rotation speed of the wafer W in this process is, for example, 100 to 1500 rpm. The polymer aqueous solution has a lower surface tension than that of the water-based cleaning liquid, and thus is less likely to scatter when colliding with the surface of the wafer W and has high coatability. During the supply of the polymer aqueous solution, the solution supply nozzle 33 is fixed above the center of the wafer W. Then, the solution supply nozzle 33 is retracted to the outside of the cup 22.

Figure 5A:
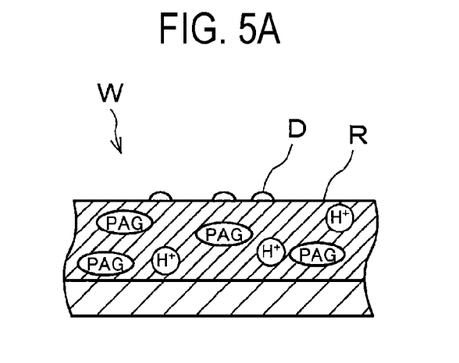
FIGS. 5A to 5D are cross-sectional views schematically illustrating states of a wafer surface before or after processes related to a cleaning process are executed.
Figure 5B:
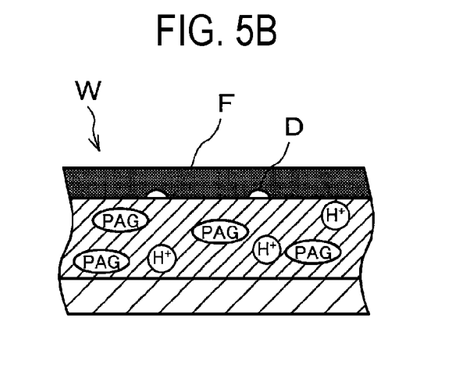

When water droplets D of the immersion water remain on the surface of the wafer W before this process as illustrated in FIG. 5A, the water droplets D are collected by the liquid film F of the polymer aqueous solution formed on the surface of the wafer W in this process, as illustrated in FIG. 5B. As a result of being collected, the water droplets D are discharged to the outside of the wafer W together with the polymer aqueous solution, or remain in the liquid film F of the polymer aqueous solution formed on the surface of the wafer W.

(Hydrophilization Process)

Figure 4C:
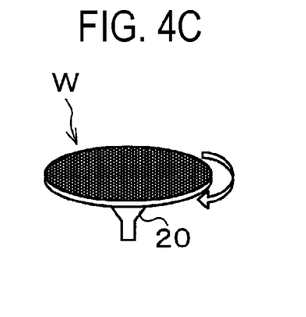
Figure 5C:
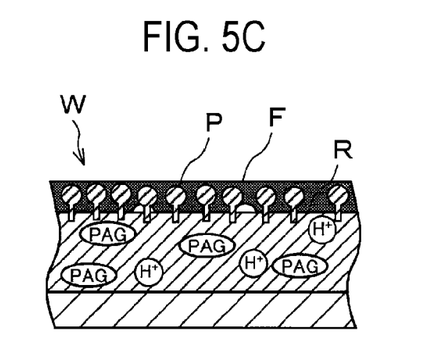

Subsequently, as illustrated in FIG. 3, the surface of the resist film is hydrophilized by the polymer aqueous solution supplied to the surface of the wafer W (process S2). Specifically, for example, as illustrated in FIG. 4C, the wafer W is left as is for a predetermined time while being rotated in the state in which the polymer aqueous solution or a cleaning liquid is not supplied. The rotation speed of the wafer W at this time is, for example, 1,500 to 2,500 rpm. By rotating the wafer W, the fluidity of the liquid film F of the polymer aqueous solution formed on the surface of the wafer W becomes lower. At the same time, by leaving the wafer W as is, as illustrated in FIG. 5C, the surface of the resist film R and the water-soluble polymer P having a hydrophilic group in the liquid film F undergo a crosslinking reaction, and the surface of the resist film R is coated with the water-soluble polymer P having a hydrophilic group. As a result, the contact angle the surface of the resist film R with respect to water decreases.

The contact angle of the surface of the resist film R with respect to water can be adjusted by adjusting a length of an execution time of this hydrophilization process. For example, it is possible to further reduce the contact angle by increasing the execution time of the hydrophilization process. The length of the execution time of the hydrophilic process is, for example, 3 to 60 seconds. In the hydrophilization process, the rotation of the wafer W may be stopped after the fluidity of the liquid film of the polymer aqueous solution disappears and there is no possibility of the polymer aqueous solution infiltrating the rear surface of the wafer W.

Figure 6:
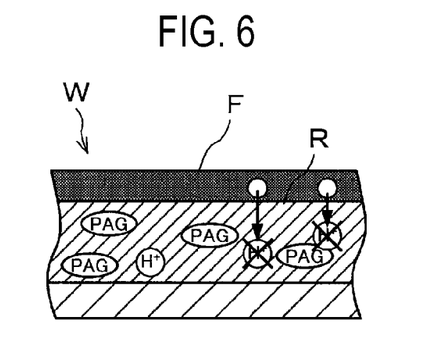
FIG. 6 is a view illustrating a change in a state of a resist film when the pH value of an aqueous solution is large.
Figure 7:
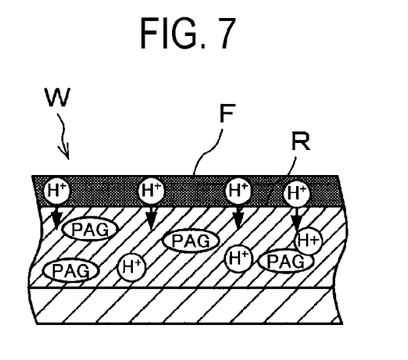
FIG. 7 is a view illustrating a change in a state of a resist film when the pH value of an aqueous solution is small.

Here, the pH value of the polymer aqueous solution will be described with reference to FIGS. 6 and 7. FIGS. 6 and 7 are views illustrating changes in a state of the resist film R when the pH value of the aqueous solution is high and when the pH value of the aqueous solution is low, respectively.

A cleaning process is performed by the cleaning apparatus 1 before a PEB process. Therefore, when the pH value of the polymer aqueous solution is high, acid ($H^+$) generated from a photo-acid generator (PAG) in the resist film R by immersion exposure reacts with the alkaline component in the liquid film F and disappears, as illustrated in FIG. 6. As a result, a resist pattern having a desired shape cannot be obtained when developed. For example, an unintended T-shaped pattern in a cross-sectional view is obtained. Further, when the pH of the water-soluble polymer aqueous solution is low, an acid component ($H^+$) is supplied from the liquid film F of the polymer aqueous solution into the resist film R, particularly to the surface of the resist film R, as illustrated in FIG. 7. As a result, a resist pattern having a desired shape cannot be obtained when developed. For example, a resist pattern having a desired film thickness cannot be obtained. In addition, there are cases where an unintended resist pattern having a rounded top portion may be obtained.

Therefore, as the water-soluble polymer aqueous solution, a polymer aqueous solution having a pH value that allows a change in the acid concentration in the resist film to fall within a permissible range and does not inhibit the reaction between the acid of the resist film and a base resin is used. In other words, a neutral polymer aqueous solution is used as the water-soluble polymer aqueous solution. Specifically, the pH value of the water-soluble polymer aqueous solution is, for example, 5 to 9, and more preferably 6 to 8.

The description will now return to the description of the cleaning process made with reference to FIGS. 3 to 5.

(Cleaning Liquid Supply Process)

After the hydrophilization process, as illustrated in FIG. 3, while rotating the wafer W, a cleaning liquid is supplied to the surface of the wafer W so as to remove the polymer aqueous solution that has not contributed to the hydrophilization (process S3). Specifically, the polymer aqueous solution that has not contributed to hydrophilization means a water-soluble polymer and a solvent, which are not bonded to the surface of the resist film R in the liquid film F of the polymer aqueous solution. By removing the polymer aqueous solution that has not contributed to hydrophilization as described above, the water droplets D of the immersion water, which are collected in the polymer aqueous solution and remain in the liquid film F, are also discharged to the outside of the wafer W.

Figure 4D:
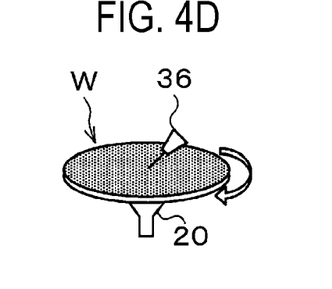
Figure 4E:
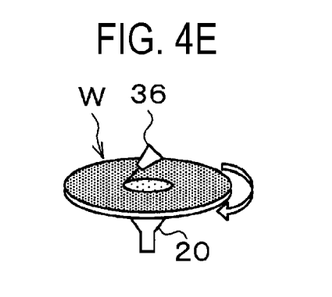
Figure 4F:
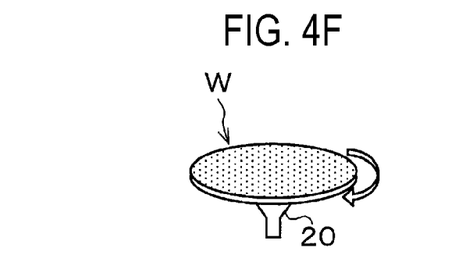

In this cleaning liquid supply process, for example, the region coated with the cleaning liquid on the wafer W may be dried simultaneously and in a parallel manner Specifically, for example, as illustrated in FIGS. 4D and 4E, the wafer W is rotated, and the cleaning liquid ejected toward the outside of the wafer from the nozzle 36 is supplied while moving the nozzle 36 such that the ejection destination from the cleaning liquid supply nozzle 36 is moved from the center of the wafer W toward the peripheral edge. This makes it possible to dry the region coated with the cleaning liquid on the wafer W from the inner side while removing the unnecessary liquid film F of the polymer aqueous solution with the cleaning liquid. In this way, when the cleaning liquid supply nozzle is moved, an inert gas such as $N_2$ gas or the like may be used to assist the drying.

When the cleaning liquid supply nozzle 36 is moved as described above, the rotation speed of the wafer W is, for example, gradually lowered. Specifically, when the ejection destination of the cleaning liquid from the cleaning liquid supply nozzle 36 is the center of the wafer W, the rotation speed of the wafer W is, for example, 1,500 to 2,000 rpm, and when the ejection destination of the cleaning liquid is the peripheral edge of the wafer W, the rotation speed may be, for example, 200 to 1,000 rpm. However, when the cleaning liquid supply nozzle 36 is moved as described above, the rotation speed of the wafer W may be fixed. In this case, the rotation speed of the wafer W is 200 to 1,000 rpm.

When the cleaning liquid supply nozzle 36 is moved as described above, the moving speed of the nozzle 36 is 20 to 60 mm/s. By increasing the moving speed of the cleaning liquid supply nozzle 36 without increasing the rotation speed of the wafer W to an allowable upper limit, it is possible to make the time required for performing the entire cleaning process equal to that of the conventional post-exposure cleaning process even if the process of supplying a polymer aqueous solution is added.

After the ejection destination of the cleaning liquid from the cleaning liquid supply nozzle 36 is moved to the peripheral edge of the wafer W, the nozzle 36 is retracted to the outside of the cup 22.

[Drying Process]

Figure 5D:
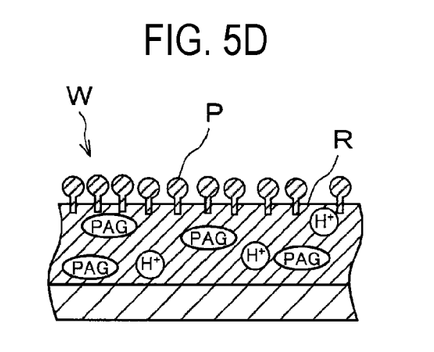

After the cleaning liquid supply process, as illustrated in FIG. 3, the wafer W supplied with the cleaning liquid is dried (process S4). Specifically, as illustrated in FIGS. 4A to 4F, the wafer W is dried by rotating the wafer W in a state in which, for example, the cleaning liquid is not supplied. On the surface of the resist film R on the dried wafer W, as illustrated in FIG. 5D, a layer bonded to the water-soluble polymer P having a hydrophilic group is left, but does not cause a problem during development. This is because the upper portion including the surface of the resist film R is removed in the process of development. When the cleaning liquid supply nozzle 36 is moved to perform drying simultaneously and in parallel with the removal of the liquid film of the polymer aqueous solution, which is performed using the cleaning liquid in process S3 as described above, the drying process in process S4 may be omitted.

After completion of the drying process, the wafer W is unloaded from the processing container 10. As a result, the cleaning process is completed.

The processing conditions (including a shape of the cleaning liquid supply nozzle) other than the rotation speed of the wafer W in the cleaning liquid supply process may be the same as those in the conventional post-exposure cleaning process.

As described above, the method of cleaning a wafer W according to the present embodiment includes a process of supplying a water-soluble polymer aqueous solution to the surface of the wafer W having thereon a resist film, on which no pattern is formed, after immersion exposure, and a process of hydrophilizing the surface of the resist film using the supplied water-soluble polymer aqueous solution. Further, after the process of hydrophilizing the surface of the resist film, the cleaning method includes a process of removing the water-soluble polymer aqueous solution, which has not contributed to the hydrophilization, on the surface of the wafer W, by supplying the cleaning liquid to the surface of the wafer W while rotating the wafer W, and a process of drying the wafer W supplied with the cleaning liquid. According to the present embodiment, even if the liquid droplets of the immersion water remain on the surface of the resist film, the liquid droplets may be removed in the process of supplying the water-soluble polymer aqueous solution, or may be collected in the liquid film of the aqueous solution in that process and may then be removed together with the liquid film in the process of supplying the cleaning liquid. Further, according to the present embodiment, since the surface of the resist film has been hydrophilized at the time of the cleaning liquid supply process, even if the rotation speed of the wafer W is increased in the cleaning liquid supply process, the scattering of the cleaning liquid is less likely to occur, and thus fine droplets of the cleaning liquid do not remain on the wafer W. This point is common either when the cleaning liquid is supplied by the above-described method during the cleaning liquid supply process or when the cleaning liquid is supplied as in the conventional post-exposure cleaning process. Therefore, according to the present embodiment, compared with the conventional post-exposure cleaning process, it is possible to prevent the water used for the immersion exposure or the cleaning liquid from remaining on the surface of the processed resist film, regardless of the degree of the contact angle of the surface of the wafer before cleaning. It is also conceivable that the lower limit value of the permissible range of the rotation speed of the wafer W in the cleaning liquid supply process increases by hydrophilizing the surface of the resist film. However, in a case in which, for example, spread and drying of the cleaning liquid are controlled by the rotation of the wafer W, it is more significant to increase the upper limit value of the permissible range rather than increasing the lower limit value of the permissible range of the rotation speed of the wafer W. In the present embodiment, the water-soluble polymer solution has a pH value that allows the acid concentration in the resist film to fall within the permissible range. Therefore, the water-soluble polymer solution does not prevent a resist pattern having a desired shape from being obtained.

According to an investigation performed by the inventors, in the case where the contact angle of the surface of the resist film with respect to water was about 80 degrees, the contact angle decreased by about 5 to 15 degrees to become about 75 degrees to 65 degrees by hydrophilizing the surface of the resist film by supplying the soluble polymer aqueous solution, and then supplying the cleaning liquid. Further, in the case where the cleaning liquid was supplied to the peripheral edge of the wafer W at which the cleaning liquid is most likely to be scattered, when the contact angle was 80 degrees to 90 degrees, the cleaning liquid was scattered unless the rotation speed of the wafer W was less than 600 rpm. In contrast, when the contact angle was 70 degrees to 75 degrees, the scattering of the cleaning liquid did not occur even when the rotation speed of the wafer W was 800 rpm. From this point as well, it can be said that according to the present embodiment, compared with the conventional post-exposure cleaning process, it is possible to prevent the water used for the immersion exposure or the cleaning liquid from remaining on the surface of the processed resist film, regardless of the degree of the contact angle of the surface of the wafer before cleaning.

In the present embodiment, even if it was necessary to increase the flow rate of the cleaning liquid in order to remove the liquid film of the water-soluble polymer aqueous solution, since the surface of the resist film has been hydrophilized at the time of the process of supplying the cleaning liquid, the cleaning liquid does not scatter even if the flow rate of the cleaning liquid is increased.

In the present embodiment, the solvent of the water-soluble polymer solution is water and does not contain an organic solvent. This is because, when the water-soluble polymer solution contains an organic solvent, deterioration of the pattern shape such as reduction of the resist film may occur when the water-soluble polymer solution is supplied to the wafer W. This is also because, when the polymer aqueous solution contains an organic solvent, it is necessary to separate the organic solvent when disposing of the solution if the waste liquid line for the cleaning liquid that uses pure water and the polymer aqueous solution is shared.

As described above, in the cleaning liquid supply process, the nozzle 36 is moved such that the ejection destination from the cleaning liquid supply nozzle 36 moves from the center of the wafer W toward the peripheral edge. In this cleaning liquid supply process, the nozzle 36 may be moved until the ejection destination of the cleaning liquid from the cleaning liquid supply nozzle 36 reaches a bevel on the peripheral edge of the wafer W. This makes it possible to clean the bevel of the wafer W using the cleaning liquid. Specifically, it is possible to clean off foreign matter attached to the bevel on the wafer W in the immersion exposure process or a process prior to the same using the cleaning liquid. For cleaning the bevel, the movement of the cleaning liquid supply nozzle 36 may be stopped at a position where the ejection destination of the cleaning liquid is the bevel.

Figure 8:
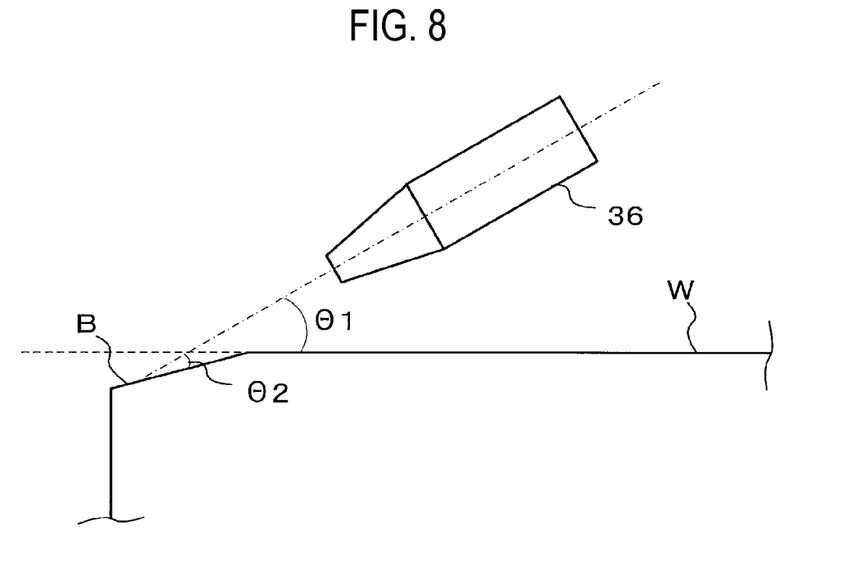
FIG. 8 is a side view for explaining a configuration of a cleaning liquid supply nozzle.

FIG. 8 is a side view for explaining a configuration of the cleaning liquid supply nozzle 36. The nozzle diameter of the cleaning liquid supply nozzle 36 is the same as a nozzle used in the conventional post-exposure cleaning process, and is, for example, 1.0 to 2.5 mm. The cleaning liquid supply nozzle 36 is tilted with respect to the surface of the wafer W as illustrated in the drawing such that the liquid film of the polymer aqueous solution can be efficiently removed by the cleaning liquid. The ejection angle θ1 of the cleaning liquid with respect to the surface of the wafer W is specifically, for example, 15 degrees to 50 degrees. The flow rate of the cleaning liquid from the cleaning liquid supply nozzle 36 is 150 to 400 ml/min, which is relatively large. Since the cleaning liquid supply nozzle 36 has the same nozzle diameter as the conventional one as described above, the flow speed of the cleaning liquid from the nozzle 36 is increased by increasing the flow rate. By increasing the flow speed of the cleaning liquid, it is possible to easily remove unnecessary liquid film of the water-soluble polymer aqueous solution. As described above, since the surface of the resist film has been hydrophilized at the time of the process of supplying the cleaning liquid, the cleaning liquid does not scatter even if the flow speed of the cleaning liquid is increased.

The ejection angle of the cleaning liquid from the cleaning liquid supply nozzle 36 is inclined towards a side opposite to the surface of the wafer W with respect to the plane of the surface of the bevel on the peripheral edge of the wafer W. As a result, it is possible to reliably clean the bevel using the cleaning liquid. The angle θ2 of the cleaning liquid with respect to the bevel on the peripheral edge of the wafer W of the cleaning liquid supply nozzle 36 is, for example, 5 to 15 degrees.

According to the present disclosure, in a substrate processing method and a substrate processing apparatus for processing a substrate having, on a surface thereof, a resist film on which no pattern is formed, after immersion exposure, it is possible to prevent water used for the immersion exposure or a cleaning liquid from remaining on the surface of the processed substrate, regardless of the degree of the contact angle of the surface of the substrate before processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The following configurations also belong to the technical scope of the present disclosure. (1) A substrate processing method including: supplying a water-soluble polymer solution to a surface of a substrate having, on the surface of the substrate, a resist film on which no pattern is formed, after an immersion exposure process; hydrophilizing a surface of the resist film using the supplied water-soluble polymer solution; supplying, after the hydrophilizing, a cleaning liquid to the surface of the substrate while rotating the substrate to remove the water-soluble polymer solution that has not contributed to the hydrophilizing; and drying the substrate supplied with the cleaning liquid, wherein the water-soluble polymer solution has a pH value that allows an acid concentration in the resist film to fall within a permissible range. According to the feature of item (1), it is possible to prevent the water used for the immersion exposure or the cleaning liquid from remaining on the surface of the substrate, regardless of the degree of the contact angle of the surface of the wafer before processing.

(2) The substrate processing method of item (1), wherein the substrate to be processed is a substrate after the immersion exposure process and before a post-exposure bake process performed between the immersion exposure process and a development process.

(3) The substrate processing method of item (1) or (2), wherein the pH value of the water-soluble polymer solution is 5 to 9.

(4) The substrate processing method of any one of items (1) to (3), wherein the solvent of the water-soluble polymer solution is water and does not contain an organic solvent.

(5) The substrate processing method of any one of items (1) to (4), wherein a surfactant is added to the water-soluble polymer solution.

(6) The substrate processing method of any one of items (1) to (5), wherein the cleaning liquid is water.

(7) The substrate processing method of any one of items (1) to (6), wherein the supplying the cleaning liquid and the drying the substrate are performed simultaneously and in parallel with each other, and in the supplying of the cleaning liquid and the drying of the substrate, the cleaning liquid ejected from a supply nozzle toward an outside of the substrate is supplied while moving the supply nozzle such that an ejection destination of the cleaning liquid from the supply nozzle moves from a center of the substrate toward a peripheral edge of the substrate.

(8) The substrate processing method of item (7), wherein, when the cleaning liquid is supplied, a rotation speed of the substrate is lowered as the supply nozzle moves.

(9) The substrate processing method of item (7) or (8), wherein, when the cleaning liquid is supplied, the supply nozzle is moved such that the ejection destination reaches a bevel on the peripheral edge of the substrate.

(10) The substrate processing method of item (9), wherein an ejection angle of the cleaning liquid from the supply nozzle is inclined to a side opposite to the surface of the substrate with respect to the bevel on the peripheral edge of the substrate.

(11) A substrate processing apparatus for processing a substrate after an immersion exposure process, the substrate having, on a surface thereof, a resist film on which no pattern is formed, the substrate processing apparatus including: a substrate holder configured to hold the substrate; a rotation mechanism configured to rotate the substrate holder; a solution supply nozzle configured to supply a water-soluble polymer solution to the substrate held by the substrate holder; a cleaning liquid supply nozzle configured to supply a cleaning liquid to the substrate held by the substrate holder; and a controller configured to control the rotation mechanism, supply from the solution supply nozzle, and supply from the cleaning liquid supply nozzle, wherein the controller is configured to perform control so as to execute process: supplying the water-soluble polymer solution to the surface of the substrate; hydrophilizing a surface of the resist film using the supplied water-soluble polymer solution; supplying, after the hydrophilizing, the cleaning liquid to the surface of the substrate while rotating the substrate to remove the water-soluble polymer solution that has not contributed to the hydrophilizing; and drying the substrate supplied with the cleaning liquid, and wherein the water-soluble polymer solution has a pH value that allows an acid concentration in the resist film to fall within a permissible range.

What is claimed is:

1. A substrate processing method comprising:
    supplying a water-soluble polymer solution to a surface of a substrate having, on the surface of the substrate, a resist film on which no pattern is formed, after an immersion exposure process;
    hydrophilizing a surface of the resist film using the supplied water-soluble polymer solution;
    supplying, after the hydrophilizing, a cleaning liquid to the surface of the substrate while rotating the substrate to remove the water-soluble polymer solution that has not contributed to the hydrophilizing; and
    drying the substrate supplied with the cleaning liquid,
    wherein a pH value of the water-soluble polymer solution is 5 to 9.

2. The substrate processing method of claim 1, further comprising: before supplying the water-soluble polymer solution, providing the substrate that has been subjected to the immersion exposure process and not yet subjected to a post-exposure bake process that is to be performed between the immersion exposure process and a development process.

3. The substrate processing method of claim 1, wherein a solvent of the water-soluble polymer solution is water and does not contain an organic solvent.

4. The substrate processing method of claim 1, wherein a surfactant is added to the water-soluble polymer solution.

5. The substrate processing method of claim 1, wherein the cleaning liquid is water.

6. The substrate processing method of claim 1, wherein the supplying of the cleaning liquid and the drying of the substrate are performed simultaneously and in parallel with each other, and > in the supplying of the cleaning liquid and the drying of the substrate, the cleaning liquid is ejected from a supply nozzle while moving the supply nozzle such that an ejection destination of the cleaning liquid from the supply nozzle moves from a center of the substrate toward a peripheral edge of the substrate.

7. The substrate processing method of claim 6, wherein when the cleaning liquid is supplied, a rotation speed of the substrate is lowered as the supply nozzle moves.

8. The substrate processing method of claim 6, wherein when the cleaning liquid is supplied, the supply nozzle is moved such that the ejection destination reaches a bevel on the peripheral edge of the substrate.

9. The substrate processing method of claim 8, wherein an ejection angle of the cleaning liquid from the supply nozzle is inclined with respect to a plane of a surface of the bevel on the peripheral edge of the substrate.

\* \* \* \* \*